(12) United States Patent
Yoo

(10) Patent No.: US 8,717,530 B2
(45) Date of Patent: May 6, 2014

(54) ARRAY SUBSTRATE FOR TRANSREFLECTIVE LIQUID CRYSTAL DISPLAY, MANUFACTURING METHOD THEREOF AND LIQUID CRYSTAL DISPLAY

(75) Inventor: Seongyeol Yoo, Beijing (CN)

(73) Assignee: Beijing Boe Optoelectronics Technology Co., Ltd., Beijing (CN)

(*) Notice: Subject to any disclaimer, the term of this patent is extended or adjusted under 35 U.S.C. 154(b) by 775 days.

(21) Appl. No.: 12/277,487

(22) Filed: Nov. 25, 2008

(65) Prior Publication Data

US 2009/0251646 A1 Oct. 8, 2009

(30) Foreign Application Priority Data

Apr. 3, 2008 (CN) .......................... 2008 1 0103436

(51) Int. Cl.
| | | |
|---|---|---|
| G02F 1/13 | (2006.01) | |
| G02F 1/1335 | (2006.01) | |
| G02F 1/1343 | (2006.01) | |
| G01R 31/26 | (2006.01) | |
| H01L 21/66 | (2006.01) | |
| H01L 21/00 | (2006.01) | |

(52) U.S. Cl.
USPC ........... 349/187; 349/114; 349/144; 349/147; 438/30

(58) Field of Classification Search
USPC ......... 349/114, 144, 147, 187, 113, 139, 142, 349/143; 438/30; 257/59, 72
See application file for complete search history.

(56) References Cited

U.S. PATENT DOCUMENTS

| 7,212,265 B2* | 5/2007 | Eguchi et al. ................. 349/113 |
| 7,423,712 B2* | 9/2008 | Jeoung et al. ................. 349/114 |
| 2005/0140877 A1* | 6/2005 | Jeoung et al. ................. 349/114 |
| 2008/0266480 A1* | 10/2008 | Lee ................................ 349/48 |

FOREIGN PATENT DOCUMENTS

JP 07028073 A * 1/1995 ............ G02F 1/1343

* cited by examiner

*Primary Examiner* — Lucy Chien
*Assistant Examiner* — Paisley L Arendt
(74) *Attorney, Agent, or Firm* — Ladas & Parry LLP

(57) ABSTRACT

An embodiment of the invention provides an array substrate for a liquid crystal display comprising a substrate and a gate scanning line, a thin film transistor, a data line, and a passivation layer on the substrate, the passivation layer covering the gate scanning line, the thin film transistor, the data line, and a through hole being formed in the passivation layer. A pixel electrode is formed on the passivation layer and comprises a transmissive part and a reflective part, the transmissive part comprises an amorphous-type indium tin oxide film and a poly-type indium tin oxide film below the amorphous-type indium tin oxide film, and the reflective part comprises the poly-type indium tin oxide film and a metal film covering the poly-type indium tin oxide film.

5 Claims, 6 Drawing Sheets

ARRAY SUBSTRATE FOR TRANSREFLECTIVE LIQUID CRYSTAL DISPLAY, MANUFACTURING METHOD THEREOF AND LIQUID CRYSTAL DISPLAY

FIELD OF THE INVENTION

The present invention relates to an array substrate, a manufacturing method thereof, and a liquid crystal display, and in particular, to an array substrate for a transreflective liquid crystal display device, a manufacturing method thereof, and a liquid crystal display using the array substrate.

BACKGROUND OF THE INVENTION

Liquid crystal displays (LCDs) have been prevailing in the market of flat display devices because they are light, thin and of low power consumption. Especially, thin film transistor liquid crystal displays (TFT-LCDs) are the currently popular type of LCDs.

LCDs depend on the light transmission characteristic of liquid crystal to display images and need an external light source because liquid crystal does not emit light by itself. According to the type of the external light source, LCDs can be classified into a transmissive type, a reflective type, and a transreflective type. Transmissive LCDs comprise a backlight under an array substrate, and the light for the liquid crystal is provided by the backlight. Reflective LCDs comprise a reflective part instead of a backlight, and the light from the external environment is reflected by the reflective part through the liquid crystal to display images. Transreflective LCDs can be deemed as the combination of the above two types of LCDs and have transmissive regions and reflective regions. Transreflective LCDs use a backlight as a light source for the transmissive regions to avoid depending on environment light, and on the other hand, they also can reflect environment light with a reflective part in the reflective regions and save power consumption, thus transreflective LCDs have the functions of both transmission and reflection of light.

In order to enhance the view angle scope of a LCD, generally a reflective part is provided on the whole array substrate in the transreflective liquid crystal display. That the reflective part is formed on the whole array substrate influences the processing such as photolithography process and etching process on the other layers formed on the substrate. In order to cope with this problem, a method is proposed in which projections are formed with a resin material on the substrate, and then a metal film is deposited on the resin projections so as to form a reflective part. Light diffuse reflection can occur on thus formed reflective part to supply light for liquid crystal.

FIG. 1 is a sectional view of an array substrate in a conventional transreflective LCD. The array substrate comprises a substrate 1, a gate scanning line and a data line that are formed on the substrate 1, and a thin film transistor 20 comprising a gate electrode 2, an active layer 8, a source electrode 5, and a drain electrode 6. An insulating layer 3 made of silicon nitride (SiNx) is disposed between the gate electrode and the active layer as a gate dielectric layer, the thin film transistor 20 and the data line 2 are covered by a passivation layer 9, and a pixel electrode 10 is formed on a portion of the passivation layer 9 other than that corresponding to the thin film transistor 20. The pixel electrode 10 comprises a transmissive region 30 and a reflective region 40, and is connected with the drain electrode 6 through a passivation through hole 7. Generally, the reflective part is formed with resin projections 14 and a metal film 13 provided on the resin projections, and the reflective part can be formed on the pixel electrode, under the pixel electrode 10, or in the same layer as the pixel electrode 10. Light diffuse reflection can occur when light is irradiated on the metal film 13 so as to supply the reflected light for the liquid crystal between the array substrate and a color filter substrate facing the array substrate. In order to fabricate the array substrate of the above configuration, the patterning process comprising photolithography and etching with a mask is used to form the layer structure. One exemplary method for the patterning process comprises the following steps: depositing a desired material for the layer to be fabricated; applying a photoresist film on the layer; exposing with a mask; developing the exposed photoresist film to form a photoresist pattern; etching the layer with the photoresist pattern as an etching mask; removing the residual photoresist pattern so that the layer is patterned as required. Besides the above method for fabricating the resin projections 14, SiNx can be used to form the projections so as to avoid the problem that the resin material can not be processed at a high temperature and to improve the processing ability at a low temperature.

However, there are the following problems in the conventional method. The size of the projections formed by the resin materials is relatively large, which increases the thickness of the final product, so that the use of photolithography process is highly limited. Since a patterning process is performed on the resin materials, the processes of masking, exposing, and etching are increased by 2-3 times. The effect of the light diffuse reflection is not very good, because it is dependent on the thickness of the projections and the size of the trenches between the projections. The resin projections formed by patterning resin material normally have a relatively large size and a relatively large gap, thus the reflectivity is uniformed across the substrate and the poor light diffuse reflection leads to a limited emitting angle range of the reflected light. Therefore, for the array substrate fabricated by the above conventional method, the effect of the light diffuse reflection is not desirable. Moreover, the manufacturing procedure is complicated and the yield is low. Also, the quality of the final product is decreased and the cost is increased.

SUMMARY OF THE INVENTION

An embodiment of the invention provides a method of manufacturing an array substrate, comprising the steps of: (a) forming a gate scanning line, a thin film transistor, a data line, a passivation layer as an overlying layer, and a through hole in the passivation layer on a substrate; (b) depositing amorphous-type indium tin oxide film after step (a) and heating the substrate at a predetermined temperature thereby achieving a phase-transition at bottom of the indium tin oxide film from amorphous-type into poly-type; (c) patterning the indium tin oxide film to form a pixel electrode, which comprises a transmissive region and a reflective region, on the substrate after step (b) and removing the amorphous-type indium tin oxide film of the reflective region so that the poly-type indium tin oxide are left in the reflective region to form a reflective region pattern; and (d) depositing and patterning a metal material on the substrate after step (c) thereby forming a metal film on the reflective region pattern.

Another embodiment of the invention provides an array substrate for a liquid crystal display comprising a substrate and a gate scanning line, a thin film transistor, a data line, and a passivation layer on the substrate, the passivation layer covering the gate scanning line, the thin film transistor, the data line, and a through hole being formed in the passivation layer. A pixel electrode is formed on the passivation layer and comprises a transmissive part and a reflective part, the transmissive part comprises an amorphous-type indium tin oxide film and a poly-type indium tin oxide film below the amorphous-type indium tin oxide film, and the reflective part comprises the poly-type indium tin oxide film and a metal film covering the poly-type indium tin oxide film.

Further another embodiment provides a liquid crystal display comprising an array substrate, a color filter substrate facing the array substrate, and a liquid crystal layer interposed between the array substrate and the color filter substrate. The array substrate comprising a substrate and a gate scanning line, a thin film transistor, a data line, and a passivation layer on the substrate, the passivation layer covering the gate scanning line, the thin film transistor, the data line, and a through hole being formed in the passivation layer. A pixel electrode is formed on the passivation layer and comprises a transmissive part and a reflective part, the transmissive part comprises an amorphous-type indium tin oxide film and a poly-type indium tin oxide film below the amorphous-type indium tin oxide film, and the reflective part comprises the poly-type indium tin oxide film and a metal film covering the poly-type indium tin oxide film.

The embodiments of the invention make use of the crystallization characteristic of the indium tin oxide to form poly-type indium tin oxide grains in an amorphous-type indium tin oxide film for forming the roughness in the reflective part. Comparing with the projections fabricated with SiNx or a resin material, the invention can obtain the following advantages.

(1) The poly-type indium tin oxide grains can be fabricated in fabricating the pixel electrode, and the process for forming the poly-type indium tin oxide grains by etching has the decreased complexity compared with the etching process for forming resin partials, thus the embodiment of the invention can simplify the manufacturing procedure of the array substrate, increase the produce efficiency, and decrease the product cost.

(2) The existing material for forming the pixel electrode can be used to fabricate the poly-type indium tin oxide grains, which avoids the influence on the existing pixel electrode.

(3) The size, gap, and distribution of the poly-type indium tin oxide grains can be adjusted by controlling the deposition temperature and the deposition thickness of the amorphous-type indium tin oxide film, and the size uniformity of the poly-type indium tin oxide grains is low, so that the diffuse reflection effect of the reflective part of the embodiments can be remarkably increased.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

A first embodiment of a method of manufacturing an array substrate according to the invention is described below.

Figure 1:
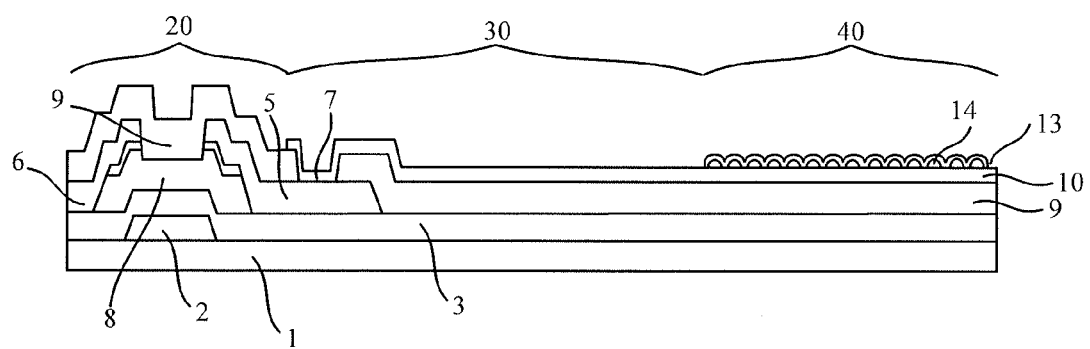
FIG. 1 is a sectional view of an array substrate of a conventional liquid crystal display.
Figure 2:
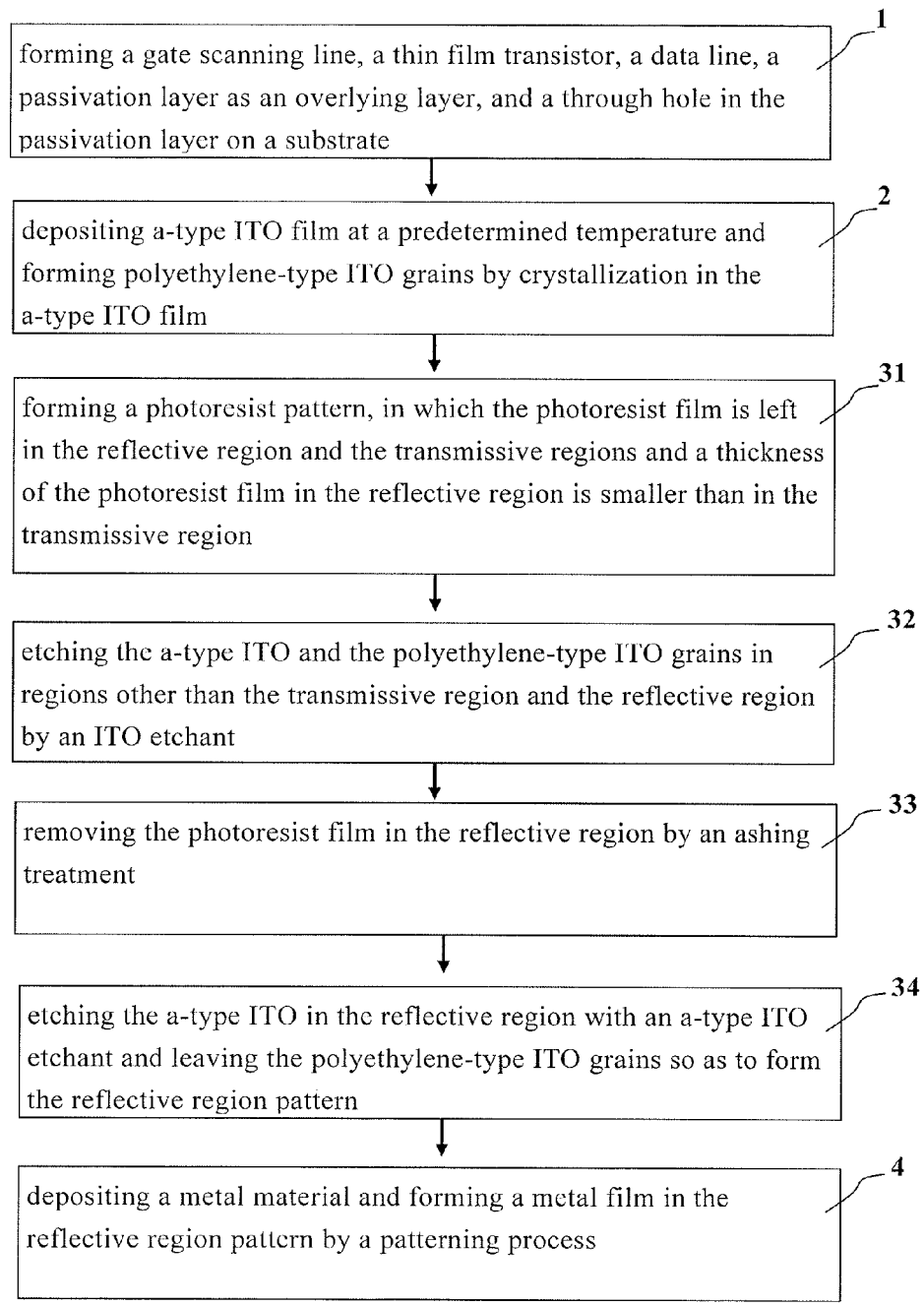
FIG. 2 is a flow chart of a first embodiment of a method of manufacturing an array substrate according to the invention.

FIG. 2 is a flow chart of the first embodiment of the method of manufacturing an array substrate according to the invention. The method is adapted to manufacture the array substrate of a transreflective type, the steps of which are described as follows.

Figure 3:
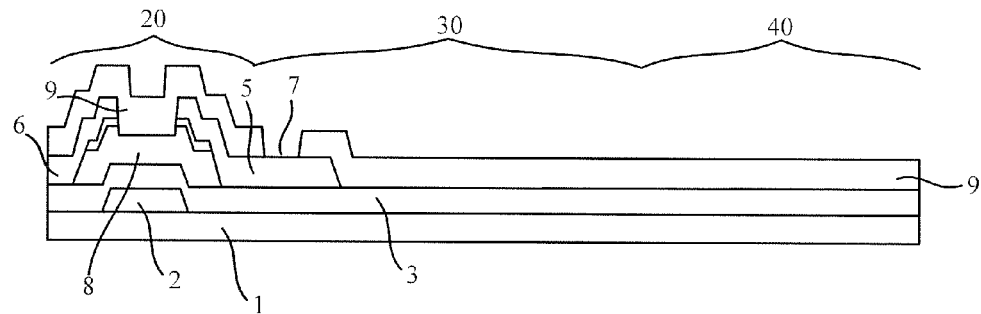
FIG. 3 is a sectional view of the array substrate after step 1 in the first embodiment of the method of manufacturing an array substrate according to the invention.

Step 1. A gate scanning line, a thin film transistor 20, a data line, and a passivation layer 9 as the overlying layer are formed by forming and patterning respective layers on a substrate 1, and a passivation layer through hole 7 is formed in the passivation layer 9. The process for patterning a layer comprises the steps of applying photoresist film on the layer, exposing the photoresist film with a mask, developing the exposed photoresist film to form a photoresist pattern, etching the layer with the photoresist pattern, and the like. The thin film transistor 20 comprises a gate electrode 2, an active layer 8, a source electrode 5 and a drain electrode 6. FIG. 3 is a sectional view of the substrate 1 after step 1. In particular, a gate film is deposited on the substrate 1 (e.g., a glass substrate) and is patterned to form the gate scanning line and the gate electrode 2 connecting with each other; a gate insulating layer 3 is deposited on the substrate; an active film is deposited on the insulating layer 3 and is patterned to form the active layer 8; a source/drain film is deposited on the substrate and is patterned to form the source electrode 5 and the drain electrode 6 overlapping with the active layer 8 with the data line being connected with the source electrode 5; then, the passivation layer (e.g., a SiNx layer) 9 is deposited on the substrate to cover the above layers and is patterned to form the passivation layer through hole 7 therein. The passivation layer through hole 7 is formed above the drain electrode 6 and to expose the drain electrode 6, so that the pixel electrode to be formed subsequently can be connected with the drain electrode 6 though the passivation through hole 7.

Figure 4:
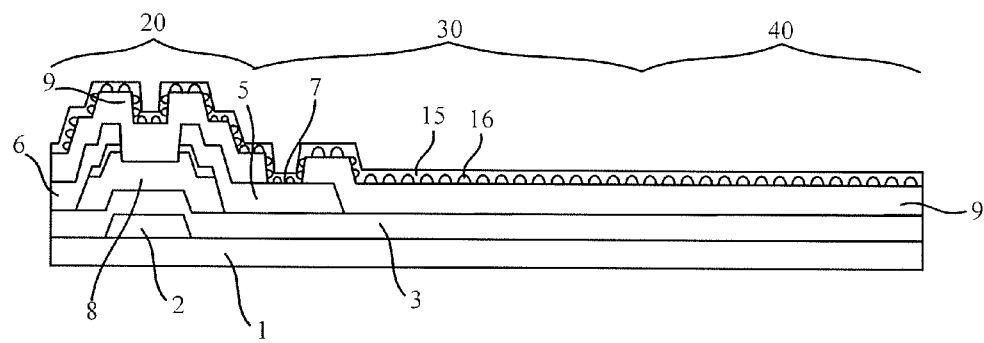
FIG. 4 is a sectional view of the array substrate after step 2 in the first embodiment of the method of manufacturing an array substrate according to the invention.

Step 2. On the substrate 1 after step 1, an amorphous type indium tin oxide (a-ITO) layer 15 is deposited at a predetermined temperature, and then a poly-type indium tin oxide (poly-ITO) grains 16 are formed in the a-ITO layer 15 by crystallization that is, a phase-transition is achieved at the bottom of the indium tin oxide film from amorphous-type into poly-type. The preferable temperature for crystallizing the a-ITO layer 15 is a medium temperature of 80-150° C. FIG. 4 is the sectional view of the substrate 1 after step 2. The a-ITO layer 15 is deposited on the passivation layer 9, and the poly-ITO grains 16 are formed in the a-ITO layer 15.

Figure 5:
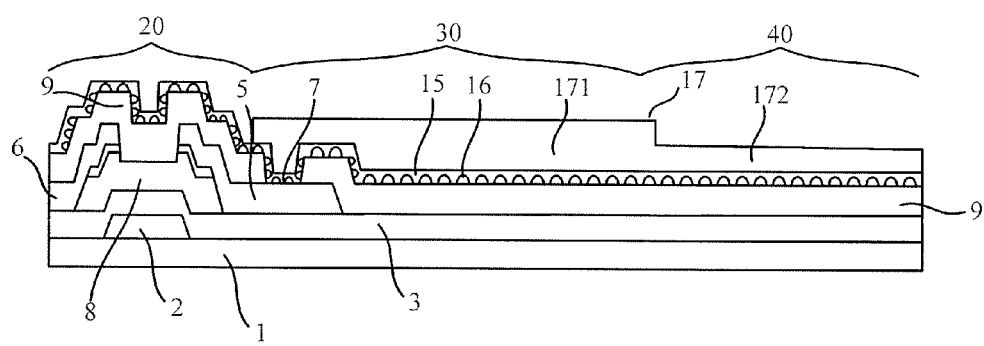
FIG. 5 is a sectional view of the array substrate after step 31 in the first embodiment of the method of manufacturing an array substrate according to the invention.

Step 31. A photoresist film 17 is applied on the substrate 1 after step 2, and a photoresist pattern is formed by exposing the photoresist film 17 with a mask and developing the exposed photoresist film. In exposing, the mask may be a half tone mask or a gray tone mask, so that a three-dimensional photoresist pattern can be obtained. In particular, the portion of the photoresist film corresponding to a transmissive region 30 of the pixel electrode to be formed is not exposed; the portion of the photoresist film corresponding to a reflective region 40 of the pixel electrode to be formed is partially exposed; and the portion of the photoresist film corresponding to the regions other than the transmissive region 30 and the reflective region 40 of the pixel electrode to be formed are fully exposed. Therefore, in developing, the fully exposed portion of the photoresist film is full removed, the partially exposed portion is partially removed, and the unexposed portion is remained as it is. That is, the thickness of the photoresist film in the reflective region is less than that of the photoresist film in the transmissive region. It is preferable that the thickness of the photoresist film in the transmissive region is about two times as large as that in the reflective region 40. Here, the photoresist film in the transmissive region can be referred to as a full thickness photoresist film 171, and the photoresist film in the reflective region can be referred to as a half thickness photoresist film 172, as shown in FIG. 5.

Figure 6:
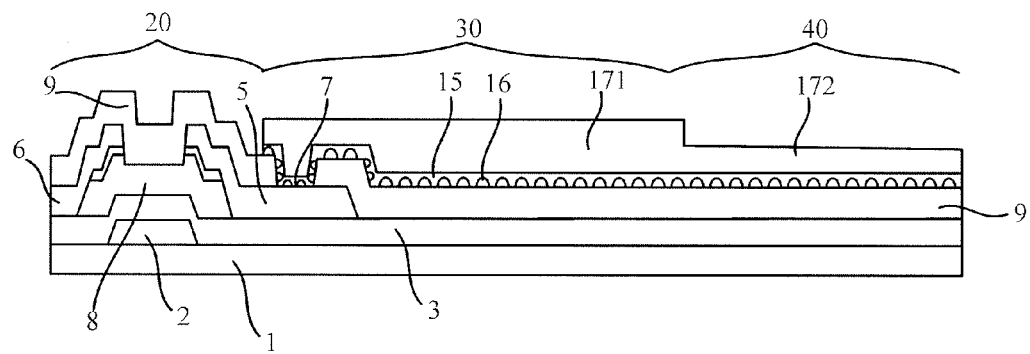
FIG. 6 is a sectional view of the array substrate after step 32 in the first embodiment of the method of manufacturing an array substrate according to the invention.

Step 32. With the photoresist pattern as an etching mask, the a-ITO layer 15 and the poly-ITO grains 16 in the regions other than the transmissive region 30 and the reflective region 40 of the pixel electrode to be formed on the substrate 1 is etched away by an ITO etchant so as to form the pixel electrode with the transmissive region 30 and the reflective region 40. The ITO etchant has an etching effect on both the a-ITO layer 15 and the poly-ITO material, and for example, ITO etchant may be HCl based etchant. The relative position and area relationships between the transmissive region 30 and the reflective region 40 on the substrate 1 are predetermined, depending on the expected transmission and reflection characteristics of the transreflective LCD. The transmissive region 30 and the reflective region 40 generally do not cover the region corresponding to the thin film transistor 20, as shown in the sectional view of the array substrate after step 32 of FIG. 6.

Figure 7:
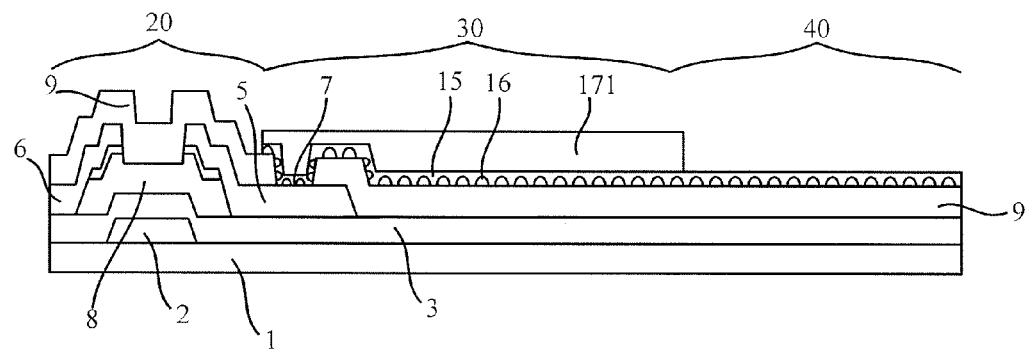
FIG. 7 is a sectional view of the array substrate after step 33 in the first embodiment of the method of manufacturing an array substrate according to the invention.

Step 33. The half thickness photoresist film 172 in the pixel electrode reflective region 40 is removed by a photoresist ashing treatment. The ashing treatment is performed in an appropriate extent on the photoresist film 17 so that the photoresist film 17 is thinned by a certain thickness. Since the thickness of the half thickness photoresist film 172 in the reflective region 40 is smaller than that of the full thickness photoresist film 171 in the transmissive region 30, in this step the half thickness photoresist film 172 formed in step 31 is entirely removed by the ashing treatment and the full thickness photoresist film 171 is partially removed by ashing treatment and partially remained with a certain thickness. The thickness difference between the full thickness photoresist film 171 in the transmissive region 30 and the half thickness photoresist film 172 in the reflective region 40 before the ashing treatment may be determined as required. It is necessary for the full thickness photoresist 171 left in the transmissive region 30 after the ashing treatment to protect the underlying layer, and on the other hand, the thickness difference may be not excessively large because it increases the cost of the material. FIG. 7 shows the sectional view of the substrate 1 after step 33.

Figure 8:
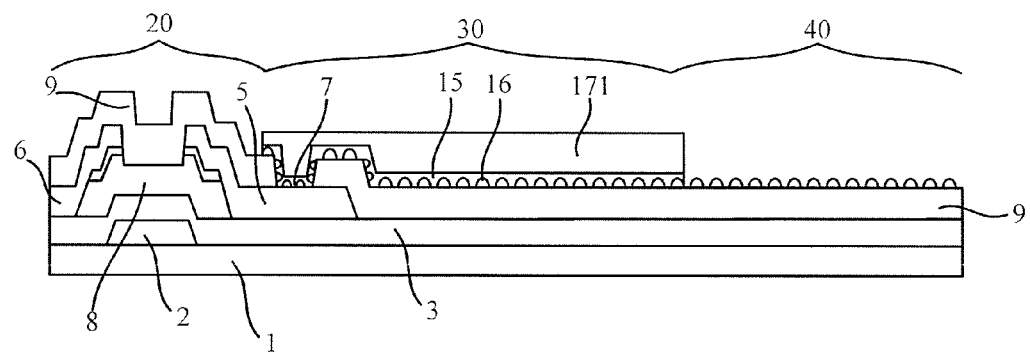
FIG. 8 is a sectional view of the array substrate after step 34 in the first embodiment of the method of manufacturing an array substrate according to the invention.

Step 34. The a-ITO layer 15 in the reflective region 40 is etched away by an a-ITO etchant, and the poly-ITO grains 16 are exposed so as to form a reflective region pattern. FIG. 8 shows the sectional view of the substrate 1 after step 34. In this step, the a-ITO etchant is specially used for the a-ITO layer but does not work on the poly-ITO grains. For example, the a-ITO etchant may be $H_2SO_4$ or $H_2O_2$ based etchant. In addition, the a-ITO layer 15 in the transmissive region 30 is left due to the protection of the remained full thickness photoresist film 171.

Figure 9:
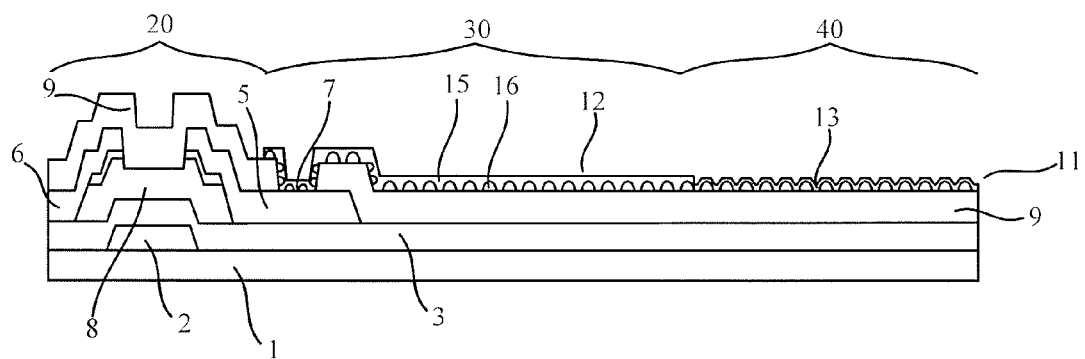
FIG. 9 is a sectional view of the array substrate after step 4 in the first embodiment of the method of manufacturing an array substrate according to the invention.

Step 4. After the residuals of the photoresist film is removed, a metal material is deposited on the substrate 1 after step 34, and a metal film 13 is formed and patterned on the poly-ITO grains 16 in the reflective region 40, i.e., on the reflective region pattern. The detailed processes are as follows. A photoresist film is applied on the metal film 13, and after exposing and developing, a photoresist pattern is left in the reflective region 40 only, so that the metal film in regions other than the reflective region 40 can be etched away, that is, the metal film 13 is left in the reflective region 40 only. The left metal film 13 with the poly-ITO grains 16 forms a reflective part 11. FIG. 9 shows the sectional view of the substrate 1 after step 4. The method for manufacturing the array substrate is completed here.

This embodiment utilizes the crystallization characteristic of the ITO material. Generally the a-ITO material can be completely formed at the room temperature, e.g., 25° C., and the poly-ITO is completely formed at about 250° C., so that the a-ITO material can be crystallized into the poly-ITO grains at an appropriate temperature. In step 2, for example, when the a-ITO is deposited at a temperature of 80 ~150° C., the a-ITO material is crystallized and the poly-ITO appears in the a-ITO. The higher the deposition temperature is, the more poly-ITO grains are formed. The grains of an appropriate size can be obtained by selecting deposition thickness and deposition temperature for the a-ITO material. The preferable deposition thickness of the a-ITO material is about 2000 Å. The factors that affect the light diffuse reflection comprise the shape, size, gap, and distribution of the formed grains. In the embodiment, the poly-ITO grains are used for the roughness of the reflective part, and the appropriate grain size and the gap can be obtained by selecting the deposition thickness and the deposition temperature. The grains formed by the crystallization, compared with the particles formed by etching a resin film, can avoid the defects due to the highly uniform distribution of the particles. The resin particles in the conventional method are only adapted to reflect the light of the wavelengths of λ and λ/2. The poly-ITO grains in the embodiment are adapted to reflect the light of the wavelengths of λ, λ/2, λ/4 and λ/8, so that the diffuse reflection effect of the reflective part on the substrate in the embodiment can be remarkably increased.

The advantages of the embodiment are in that not only the effect of the diffuse reflection is improved, but also the manufacturing process of the array substrate is simplified. After depositing the a-ITO film and forming the poly-ITO grains, the a-ITO in the reflective region needs to be etched. The embodiment utilizes the different etching characteristics of the a-ITO material and the poly-ITO material and realizes the co-etching of the a-ITO material and the poly-ITO material on the thin film transistor and the single etching of the a-ITO material in the reflective region through one exposing process with a half tone mask or a gray tone mask followed by two etching process by using the etchants corresponding to the different components. The embodiment avoids repeated exposing and etching, forms the roughness for the light diffuse reflection during forming the pixel electrode, and therefore simplifies the process for manufacturing an array substrate with a reflective part. Moreover, the etching on the pixel electrode has only a minor modification with respect to the conventional etching process, bringing substantially no influence on the process for forming the other layers. The ITO material is used for the roughness for light diffuse reflection, so that material waste can be avoided, and on other hand, there is no need for additional new materials, which decreases the manufacturing cost. Therefore, the embodiment can increase the yield of the array substrate and at the same time decrease the cost.

A second embodiment of the method of manufacturing an array substrate according to the invention is described below.

Figure 10:
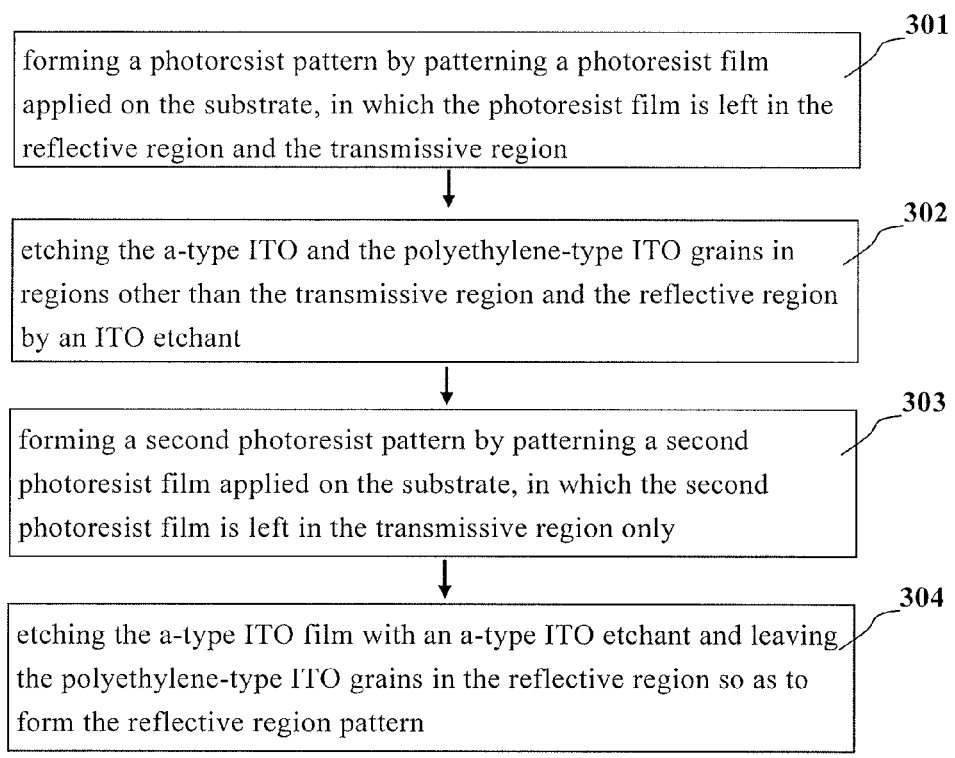
FIG. 10 is a flow chart of a second embodiment of a method of manufacturing the array substrate according to the invention.

FIG. 10 is a flow chart of the second embodiment of the method of manufacturing the array substrate. The second embodiment is different from the first embodiment mainly in that the above steps 31-34 are replaced by the following steps 301-304.

Step 301. A photoresist film is applied on the substrate 1 after step 2, and then the photoresist film is exposed with a mask and developed to form a pattern with the photoresist film remaining in the transmissive region and the reflective region.

Step 302. On the substrate after step 301, the a-ITO film and the poly-ITO grains in the regions other than the transmissive region and the reflective region are etched with an ITO etchant, so as to form the pixel electrode with the transmissive region and the reflective region.

Step 303. Another photoresist film is applied on the substrate 1 after step 302, and then this photoresist film is exposed with a mask and developed to form a pattern with the photoresist film remaining only in the transmissive region.

Step 304. On the substrate 1 after step 303, the a-ITO in the reflective region is etched with the a-ITO etchant, so that the poly-ITO grains are left in the reflective region to form the reflective region pattern.

The second embodiment adopts two exposing processes to manufacture the transmissive region of the pixel electrode and produce the poly-ITO grains in the reflective region. In the second embodiment, the reflective part on the array substrate uses the poly-ITO grains as the roughness. The forming process is simple and the size of the formed grains is sufficient to increase the effect of the light diffuse reflection. At the same time, since the manufacturing method in the second embodiment follows the same exposing and etching processes as those for forming other layer structures, without introducing new materials, there are no limitations on the manufacturing processes for other layer structures, and advantages of simplifying the manufacturing processes, increasing the product yield, and decreasing the product cost can be achieved.

The method for forming the grains in the reflective region in the array substrate according to the invention is not limited to the above two embodiments as long as the transmissive region and the reflective region of the pixel electrode can be formed on the substrate after step 2 by the exposing and etching processes, and the amorphous-type ITO material in the reflective region can be removed and the poly-type ITO grains can be left to form the reflective region pattern.

The embodiment of the array substrate according to the invention is described in the following.

The view of the array substrate of the embodiment according to the invention is shown in FIG. 9, and the array substrate may be manufactured by any one of the embodiments of the method according to the invention. The array substrate comprises a substrate 1, a gate scanning line, a thin film transistor 20, a data line, a passivation layer 9 as the overlying layer on the substrate 1. The thin film transistor comprises a gate electrode 2, an active layer 8, and source electrode 5, and a drain electrode 6. A passivation layer through hole 7 is formed in the passivation layer 9. On the passivation is formed a pixel electrode comprising a transmissive part 12 and a reflective part 11, and the preferable thickness of the pixel electrode is about 2000 Å. The transmissive part 12 and the reflective part 11 of the pixel electrode are provided in the same layer and cover the regions other than that corresponding to the thin film transistor 20 on the substrate 1. The material of the transmissive part 12 is an a-ITO film containing poly-ITO grains therein, and the reflective part 11 comprises poly-ITO grains in the reflective region pattern and a metal film 13 covering the poly-ITO grains.

In the array substrate of the embodiment, the poly-ITO grains are used as the desired roughness in the reflective part. The shape, size, gap and distribution of the grains may be controlled by selecting the deposition thickness and the deposition temperature of the amorphous-type ITO film, and the grains formed by the crystallization can avoid the defects due to the highly uniformed distribution compared with the particles formed by etching resin material. The resin particles in the conventional LCD are only adapted to reflect the light of the wavelengths of $\lambda$ and $\lambda/2$. The poly-ITO grains in the embodiments of the invention can be adapted to reflect the light of the wavelengths of $\lambda$, $\lambda/2$, $\lambda/4$ and $\lambda/8$, so that the light diffuse reflection effect of the reflective part on the array substrate can be remarkably increased.

In the embodiment, the poly-ITO grains can be formed by crystallizing an a-ITO material, so that it is not necessary to introduce new material in the manufacturing process. The array substrate can be effectively manufactured by using the existing materials for manufacturing the conventional array substrate, thus avoiding increase of material cost. Moreover, since new material is not introduced, the limitation on the structure and manufacturing processes by the new material can be avoided, and advantages of simplifying the producing procedures, increasing the product yield, and decreasing the product cost can be obtained.

The embodiment of the invention can be adapted to form the reflective part in the various types of transreflective LCDs such as twisted nematic (TN) type, in-plane switching (IPS) type, and fringe field switching (FFS) type, and may take full advantages of the various types of LCDs.

The embodiment of the liquid crystal display according to the invention is described in the following.

Figure 11:
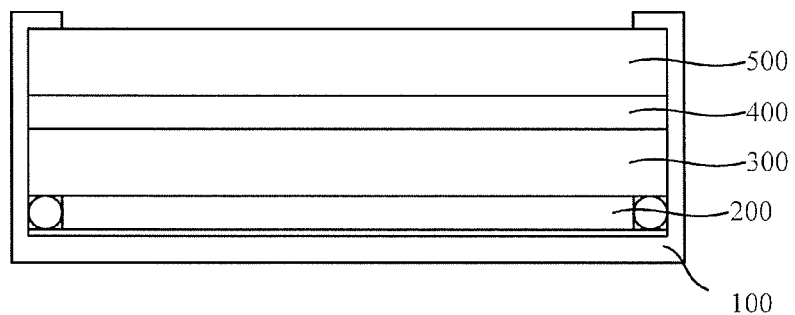
FIG. 11 is a view of an embodiment of a liquid crystal display according to the invention.

FIG. 11 is a view of an embodiment of a LCD according to the invention. The LCD comprises the array substrate 300 according to the invention which is shown in FIG. 9. The LCD further comprises a color filter substrate 500, which is bonded with the array substrate 300 in an opposing state to form a liquid crystal panel. A liquid crystal layer 400 is provided between the color filter substrate 500 and the array substrate 300. A backlight module 200 is provided under the array substrate 300 of the liquid crystal panel in the drawing, and the light emitting from the backlight module 200 passes through the transmissive part in the transmissive region of the pixel electrode on the array substrate 300 so as to supply light for the liquid crystal layer 400, and at the same time, the reflective part of the array substrate diffuses the environment light entering the liquid crystal panel from the color filter substrate side so as to supply light for the liquid crystal layer 400. An external frame 100 is further provided for fixing and supporting the above components.

The LCD of the embodiment may use any of the exemplary array substrates according to the invention and also may have the advantages of both the transmissive LCD and the reflective LCD. The LCD may either use the light supplied by the backlight module or use environment light. Further, it uses the poly-ITO grains as the desired roughness in the reflective part, the size and gap distribution of the grains may be controlled by selecting the deposition thickness and the deposition temperature of the amorphous-type ITO material, and the efficiency of the diffuse reflection is enhanced. The array substrate can be effectively formed by using the existing materials for manufacturing the conventional array substrate, thus avoiding increase of material cost. Moreover, since new material is not introduced, the limitation on the structure and manufacturing processes by the new material can be avoided, and advantages of simplifying the producing procedures, increasing the product yield, and decreasing the product cost can be obtained.

The invention being thus described, it will be obvious that the same may be varied in many ways. Such variations are not to be regarded as a departure from the spirit and scope of the invention, and all such modifications as would be obvious to those skilled in the art are intended to be comprised within the scope of the following claims.

What is claimed is:

1. A method of manufacturing an array substrate, comprising the steps of:
    (a) forming a gate scanning line, a thin film transistor, a data line, a passivation layer as an overlying layer, and a through hole in the passivation layer on a substrate;
    (b) depositing an amorphous-type indium tin oxide film after step (a) and heating the substrate at a predetermined temperature thereby achieving a phase-transition at a bottom of the indium tin oxide film from amorphous-type into poly-type;
    (c) patterning the indium tin oxide film to form pixel electrodes, each of which comprises a single transmissive region and a reflective region, on the substrate after step (b), removing only the amorphous-type indium tin oxide film of the reflective region so that the poly-type indium tin oxide are left in the reflective region to form a reflective region pattern, the entirety of the amorphous-type indium tin oxide film and the poly-type indium tin oxide film of the transmissive region remain such that the amorphous-type indium tin oxide film is continuously formed in the single transmissive region; and
    (d) depositing and patterning a metal material on the substrate after step (c) thereby forming a metal film on the reflective region pattern,
wherein step (c) comprises the steps of:
    (c-1) forming a photoresist pattern by patterning a photoresist film applied on the substrate after step (b), in which the photoresist film is left in the reflective region and the transmissive region and a thickness of the photoresist film in the reflective region is smaller than in the transmissive region;
    (c-2) etching the amorphous-type indium tin oxide and the poly-type indium tin oxide by an indium tin oxide etchant, so as to form the pixel electrode comprising the transmissive region and the reflective region;
    (c-3) removing the photoresist film in the reflective region by an ashing treatment; and
    (c-4) etching the amorphous-type indium tin oxide in the reflective region with an amorphous-type indium tin oxide etchant and leaving the poly-type indium tin oxide.

2. The method of manufacturing an array substrate of claim 1, wherein the thickness of the photoresist film in the transmissive region in step (c-1) is two times as large as that in the reflective region.

3. The manufacturing method of array substrate of claim 1, wherein in step (b) a thickness of the deposited amorphous-type indium tin oxide film is about 2000 Å.

4. The method of manufacturing an array substrate of claim 1, wherein the predetermined temperature in step (b) is in the range of 80-150° C.

5. The method of manufacturing an array substrate of claim 1, wherein among the transmissive region and the reflective region, the transmissive region is directly connected to the thin film transistor.

* * * * *